(12) United States Patent
Komoto et al.

(10) Patent No.: US 8,427,187 B2
(45) Date of Patent: *Apr. 23, 2013

(54) PROBE WAFER, PROBE DEVICE, AND TESTING SYSTEM

(75) Inventors: Yoshio Komoto, Gunma (JP); Yoshiharu Umemura, Kanagawa (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/857,483

(22) Filed: Aug. 16, 2010

(65) Prior Publication Data

US 2011/0121848 A1    May 26, 2011

Related U.S. Application Data

(63) Continuation of application No. PCT/JP2008/055789, filed on Mar. 26, 2008.

(51) Int. Cl.
*G01R 31/00* (2006.01)

(52) U.S. Cl.
USPC ............ 324/756.01; 324/762.05; 324/754.07; 324/756.03; 324/754.18

(58) Field of Classification Search .. 324/754.01–754.1, 324/754.18, 756.01–756.07, 762.01–762.05
See application file for complete search history.

(56) References Cited

U.S. PATENT DOCUMENTS

| | | | |
|---|---|---|---|
| 6,215,321 B1 * | 4/2001 | Nakata | 324/756.03 |
| 6,466,047 B1 * | 10/2002 | Doherty et al. | 324/750.25 |
| 6,480,012 B1 * | 11/2002 | Komori | 324/756.03 |
| 6,727,723 B2 * | 4/2004 | Shimizu et al. | 324/750.05 |
| 6,930,937 B2 * | 8/2005 | Lay | 365/201 |
| 2005/0225336 A1 | 10/2005 | Kojima | |
| 2006/0028227 A1 * | 2/2006 | Kim et al. | 324/763 |
| 2008/0010824 A1 | 1/2008 | Kojima | |
| 2008/0048689 A1 * | 2/2008 | Lee | 324/754 |
| 2008/0054917 A1 * | 3/2008 | Henson et al. | 324/754 |

FOREIGN PATENT DOCUMENTS

| | | |
|---|---|---|
| JP | H08-148533 A | 6/1996 |
| JP | H08-162508 A | 6/1996 |
| JP | 2002-222839 A | 8/2002 |
| JP | 2006054731 | 2/2006 |
| JP | 2006-322876 | 11/2006 |
| WO | 03/062837 | 7/2003 |

OTHER PUBLICATIONS

Chinese Office Action dated Aug. 2, 2011, in a counterpart Chinese patent application No. 200880128222.4, citing JP 8148533.
International Search Report (ISR) issued in PCT/JP2008/055789 (parent application) mailed in Jul. 2008 for Examiner consideration, citing Foreign Patent document Nos. 2 and 3 above.
Written Opinion (PCT/ISA/237) issued in PCT/JP20081055789 (parent application) mailed in Jul. 2008.

* cited by examiner

*Primary Examiner* — Arleen M Vazquez (57) ABSTRACT

There is provided a testing system for testing a plurality of semiconductor chips formed on a single semiconductor wafer. The testing system includes a wafer substrate, a plurality of wafer connector terminals that are provided on the wafer substrate in such a manner that one or more wafer connector terminals correspond to each of the semiconductor chips, where each wafer connector terminal is to be electrically connected to an input/output terminal of a corresponding semiconductor chip, a plurality of circuit units that are provided on the wafer substrate in such a manner that one or more circuit units corresponds to each of the semiconductor chips, where each circuit unit generates a test signal to be used for testing a corresponding semiconductor chip and supplies the test signal to the corresponding semiconductor chip to test the corresponding semiconductor chip, and a controller that generates a control signal used to control the plurality of circuit units.

18 Claims, 10 Drawing Sheets

PROBE WAFER, PROBE DEVICE, AND TESTING SYSTEM

BACKGROUND

1. Technical Field

The present invention relates to a probe wafer, a probe device, and a testing system.

2. Related Art

A known semiconductor chip test apparatus tests individually a plurality of semiconductor chips in a state of being formed on a semiconductor wafer (for example, see Patent Document 1). Such an apparatus may be formed with a probe card that can establish electrical connection with all of the semiconductor chips at the same time.

Patent Document 1: Japanese Patent Application Publication No. 2002-222839

Patent Document 2: International Publication No. 2003/062837

The probe card is generally formed by using a printed circuit board or the like (for example, see Patent Document 2). A plurality of probe pins are formed on the printed circuit board so that the resulting probe card can be electrically connected to all the semiconductor chips at the same time.

It should be noted, however, that the semiconductor wafer differs in coefficient of thermal expansion from the printed circuit board. Therefore, the electrical connection between the semiconductor chips and the probe card may be disconnected due to any temperature variation that may be caused by the heat generated by the semiconductor chips during tests, heating or cooling tests, and the like. This problem becomes significant for tests of semiconductor chips formed on a large-area semiconductor wafer.

A semiconductor chip test may be conducted by using, for example, a BOST circuit. In this case, a BOST circuit may be mounted on a probe card. When a semiconductor chip test is performed on a semiconductor wafer having a plurality of semiconductor chips formed thereon, however, a large number of BOST circuits need to be mounted on the probe card. It is difficult to mount all of the BOST circuits onto the printed circuit board of the probe card.

Alternatively, a semiconductor chip test may be performed by using a BIST circuit formed within a semiconductor chip. In this case, however, a semiconductor chip is required to include therein a circuit that is not to be used for its actual operation, which reduces the region in which a circuit for the actual operation of the semiconductor chip is to be formed.

A semiconductor chip test requires a very large scale test apparatus including a control main frame, a test head having therein a plurality of test modules and the like, a probe card that is to be brought into a contact with semiconductor chips, and the like. Thus, there is a demand for a smaller semiconductor chip test apparatus.

In light of the above, an advantage of some aspects of the present invention is to provide a probe wafer, a probe device, and a testing system that can solve the above-mentioned problems. This advantage is achieved by combining the features recited in the independent claims. The dependent claims define further effective specific example of the present invention.

SUMMARY

Therefore, it is an object of an aspect of the innovations herein to provide a probe wafer, a probe device and a testing system which are capable of overcoming the above drawbacks accompanying the related art. The above and other objects can be achieved by combinations described in the independent claims. The dependent claims define further advantageous and exemplary combinations of the innovations herein.

An aspect of the innovations herein provides a probe wafer to be electrically connected to a semiconductor wafer having a plurality of semiconductor chips formed thereon. The probe wafer includes a wafer substrate, and a plurality of wafer connector terminals that are provided on the wafer substrate in such a manner that one or more wafer connector terminals corresponds to each of the semiconductor chips, where each wafer connector terminal is to be electrically connected to an input/output terminal of a corresponding semiconductor chip.

A different aspect of the innovations herein provides a probe device to be electrically connected to a semiconductor wafer having a plurality of semiconductor chips formed thereon. The probe device includes a first probe wafer that is to be electrically connected to the semiconductor wafer, and a second probe wafer that is electrically connected to the first probe wafer. Here, the first probe wafer includes a first wafer substrate, a plurality of wafer connector terminals that are provided on the first wafer substrate in such a manner that one or more wafer connector terminals correspond to each of the semiconductor chips, where each wafer connector terminal is to be electrically connected to an input/output terminal of a corresponding semiconductor chip, a plurality of first intermediate connector terminals that are electrically connected to the plurality of wafer connector terminals, and a plurality of first circuit units that are provided in such a manner that one or more first circuit units correspond to each of the semiconductor chips, where each first circuit unit shapes a waveform for a signal to be supplied to a corresponding semiconductor chip in accordance with a signal received from the second probe wafer and outputs the waveform. The second probe wafer includes a second wafer substrate that opposes a surface of the first wafer substrate on which the plurality of first intermediate connector terminals are formed, a plurality of second intermediate connector terminals that are formed on the second wafer substrate in a one-to-one correspondence with the plurality of first intermediate connecter terminals, where each second intermediate connector terminal is electrically connected to a corresponding one of the first intermediate connector terminals, and a plurality of second circuit units that are provided in such a manner that one or more second circuit units correspond to each of the semiconductor chips, where each second circuit unit generates a logic pattern for a signal to be supplied to a corresponding semiconductor chip and supplies a signal corresponding to the logic pattern to a corresponding first circuit unit.

A further different aspect of the innovations herein provides a testing system for testing a plurality of semiconductor chips formed on a single semiconductor wafer. The testing system includes a wafer substrate, a plurality of wafer connector terminals that are provided on the wafer substrate in such a manner that one or more wafer connector terminals correspond to each of the semiconductor chips, where each wafer connector terminal is to be electrically connected to an input/output terminal of a corresponding semiconductor chip, a plurality of circuit units that are provided on the wafer substrate in such a manner that one or more circuit units correspond to each of the semiconductor chips, where each circuit unit generates a test signal used to test a corresponding semiconductor chip and supplying the test signal to the corresponding semiconductor chip to test the corresponding semiconductor chip, and a controller that generates a control signal used to control the plurality of circuit units.

A yet different aspect of the innovations herein provides a testing system for testing a plurality of semiconductor chips formed on a single semiconductor wafer. The testing system includes a first probe wafer that is to be electrically connected to the semiconductor wafer, a second probe wafer that is electrically connected to the first probe wafer, and a controller that generates a control signal. Here, the first probe wafer includes a first wafer substrate, a plurality of wafer connector terminals that are provided on the first wafer substrate in such a manner that one or more wafer connector terminals correspond to each of the semiconductor chips, where each wafer connector terminal is to be electrically connected to an input/output terminal of a corresponding semiconductor chip, a plurality of first intermediate connector terminals that are electrically connected to the plurality of wafer connector terminals, and a plurality of first circuit units that are provided in such a manner that one or more first circuit units correspond to each of the semiconductor chips, where each first circuit unit shapes a waveform for a signal to be supplied to a corresponding semiconductor chip in accordance with a signal received from the second probe wafer and outputs the waveform. The second probe wafer includes a second wafer substrate that opposes a surface of the first wafer substrate on which the plurality of first intermediate connector terminals are formed, a plurality of second intermediate connector terminals that are formed on the second wafer substrate in a one-to-one correspondence with the plurality of first intermediate connecter terminals, where each second intermediate connector terminal is electrically connected to a corresponding one of the first intermediate connector terminals, and a plurality of second circuit units that are provided in such a manner that one or more second circuit units correspond to each of the semiconductor chips, where each second circuit unit generates a logic pattern for a signal to be supplied to a corresponding semiconductor chip and supplies a signal corresponding to the logic pattern to a corresponding first circuit unit.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
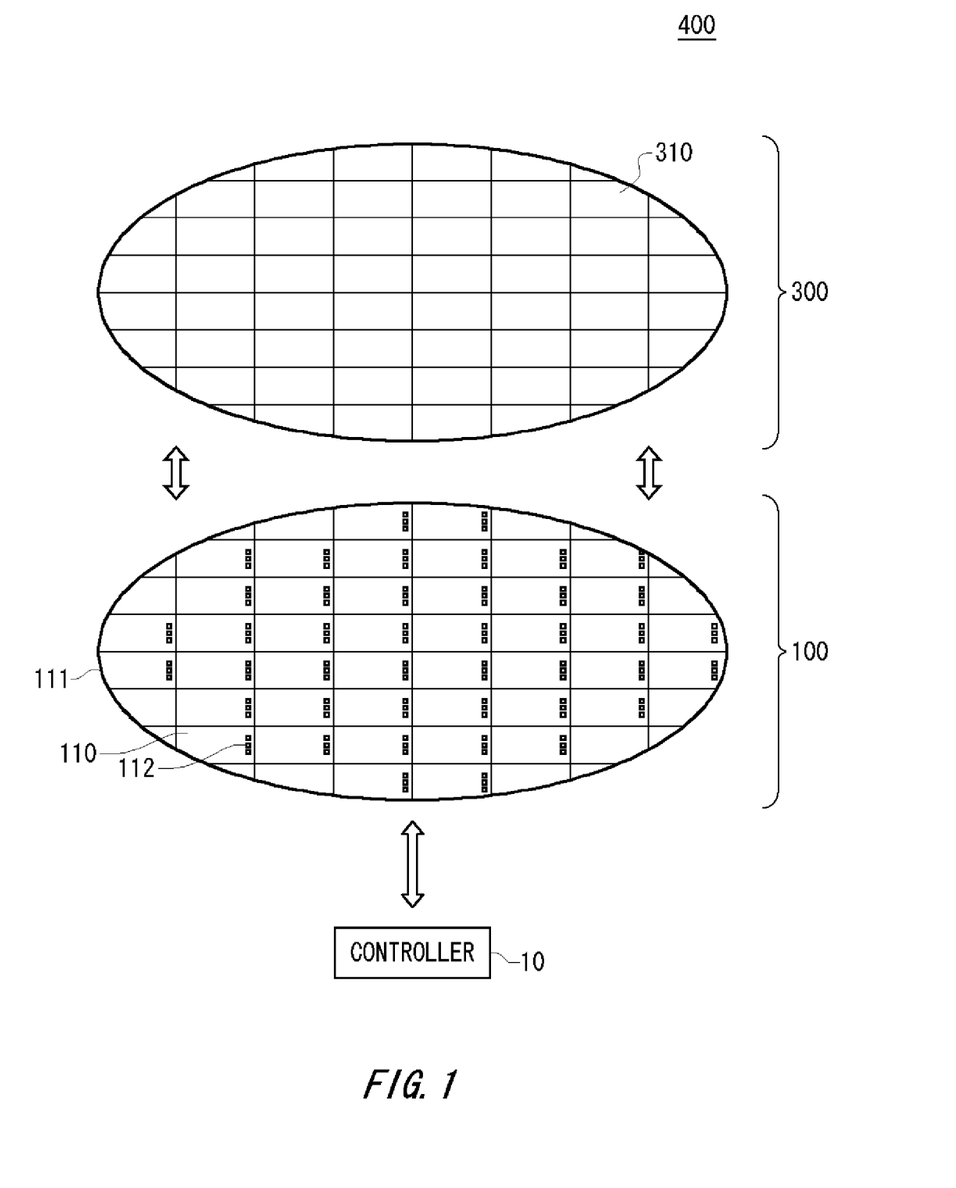
FIG. 1 illustrates an exemplary configuration of a testing system 400 relating to an embodiment of the present invention.

FIG. 1 illustrates an exemplary configuration of a testing system 400 relating to an embodiment of the present invention. The testing system 400 is configured to test a plurality of semiconductor chips 310 formed on a semiconductor wafer 300 under test. The testing system 400 includes a probe wafer 100 and a controller 10. FIG. 1 perspectively illustrates the semiconductor wafer 300 and the probe wafer 100.

The semiconductor wafer 300 may be, for example, a disk-like semiconductor substrate. More specifically, the semiconductor wafer 300 may be a semiconductor substrate formed from silicon, a compound semiconductor or the like. The semiconductor chips 310 may be formed on the semiconductor wafer 300 through semiconductor fabrication processing such as exposure.

The probe wafer 100 is electrically connected to the semiconductor wafer 300. More specifically, the probe wafer 100 establishes electrical connection with each of the semiconductor chips 310 formed on the semiconductor wafer 300. The probe wafer 100 includes a wafer substrate 111 and a plurality of wafer connector terminals 112.

The wafer substrate 111 is formed from the same semiconductor material as the substrate of the semiconductor wafer 300. For example, the wafer substrate 111 may be a silicon substrate. Alternatively, the wafer substrate 111 may be formed from a semiconductor material that has substantially the same coefficient of thermal expansion as the substrate of the semiconductor wafer 300.

The wafer substrate 111 has a wafer connecting surface that is shaped in substantially the same manner as the surface of the semiconductor wafer 300 on which the semiconductor chips 310 are formed. The wafer connecting surface may be shaped like a circle having substantially the same diameter as the corresponding surface of the semiconductor wafer 300. The wafer substrate 111 is oriented such that its wafer connecting surface opposes the semiconductor wafer 300. Alternatively, the wafer substrate 111 may be a disk-like semiconductor substrate having a larger diameter than the semiconductor wafer 300.

The wafer connector terminals 112 are formed on the wafer connecting surface of the wafer substrate 111. The wafer connector terminals 112 are provided in such a manner that at least one wafer connector terminal 112 is associated with each semiconductor chip 310. For example, the wafer connector terminals 112 may be provided in such a manner that one wafer connector terminal 112 is associated with each input/output terminal of one semiconductor chip 310. In other words, when each semiconductor chip 310 has a plurality of input/output terminals, a plurality of wafer connector terminals 112 may be provided for each semiconductor chip 310. Each wafer connector terminal 112 is electrically connected to a corresponding input/output terminal of a semiconductor chip 310.

Here, electrical connection between two components may indicate a state in which electrical signals can be exchanged between the two components. For example, the wafer connector terminals 112 may be electrically connected to the input/output terminals of the semiconductor chips 310 via a direct contact or an indirect contact through a separate conductor. Alternatively, the wafer connector terminals 112 may be electrically connected to the input/output terminals of the semiconductor chips 310 in a non-contact manner, for example, through capacitive coupling (electrostatic coupling) or inductive coupling (magnetic coupling). Alternatively, the transmission lines between the wafer connector terminals 112 and the input/output terminals of the semiconductor chips 310 may be partly formed by optical transmission lines.

The probe wafer 100 exchanges signals with the semiconductor chips 310 via the wafer connector terminals 112. The probe wafer 100 relating to the present example used in the testing system 400 supplies test signals to the semiconductor chips 310. The probe wafer 100 also receives response signals output from the semiconductor chips 310 in response to the test signals.

When the test signals are supplied from the controller 10 to the probe wafer 100, the probe wafer 100 is electrically connected to the controller 10 via device connector terminals that are formed on its device connecting surface, which is opposite to the wafer connecting surface. In this case, the probe wafer 100 may send to the controller 10 the response signals received from the semiconductor chips 310. The device connector terminals may be connected to the wafer connector terminals 112 via through holes (via holes) formed in the wafer substrate 111.

On the other hand, when the test signals are generated by the probe wafer 100, the probe wafer 100 includes a plurality of circuit units 110 that are provided in such a manner that at least one circuit unit 110 is associated with each semiconductor chip 310. The circuit units 110 are formed on the wafer substrate 111, and each circuit unit 110 exchanges signals with a corresponding semiconductor chip 310 via one or more corresponding wafer connector terminals 112.

As described above, each circuit unit 110 may generate a test signal used to test a corresponding semiconductor chip 310 and supply the generated test signal to the corresponding semiconductor chip 310 via one or more corresponding wafer connector terminals 112. Each circuit unit 110 may also receive a response signal output from the corresponding semiconductor chip 310 via the corresponding wafer connector terminals 112. Each circuit unit 110 may compare the logic pattern of the response signal with a predetermined expected value pattern to judge whether the corresponding semiconductor chip 310 is acceptable.

According to the probe wafer 100 of the present example, the wafer substrate 111 is formed from the same semiconductor material as the substrate of the semiconductor wafer 300. Therefore, despite a varying ambient temperature, the electrical connection between the probe wafer 100 and the semiconductor wafer 300 can be excellently maintained. As a result, the testing system 400 can accurately test the semiconductor wafer 300 even if the semiconductor wafer 300 is heated during tests, for example.

Since the wafer substrate 111 is formed from a semiconductor material, the circuit units 110 can be easily formed at a high density in the wafer substrate 111. For example, the circuit units 110 can be easily formed at a high density in the wafer substrate 111 by means of semiconductor fabrication processing involving exposure and the like. Thus, it is easy to form a large number of circuit units 110 in the wafer substrate 111 in correspondence with the large number of semiconductor chips 310.

By forming the circuit units 110 in the wafer substrate 111, the controller 10 can be made smaller in scale. If such is the case, for example, the controller 10 only needs to be capable of notifying the circuit units 110 of test start timings and other timings, reading test results from the circuit units 110, and supplying driving power to the circuit units 110 and the semiconductor chips 310.

In the present example, the probe wafer 100 is used in the testing system 400. However, the use of the probe wafer 100 is not limited to the testing system 400. For example, when the semiconductor chips 310 in the state of being formed on the semiconductor wafer 300 are used in an electric device or the like, the probe wafer 100 may be mounted on this electric device and electrically connected to the semiconductor wafer 300.

Figure 2:
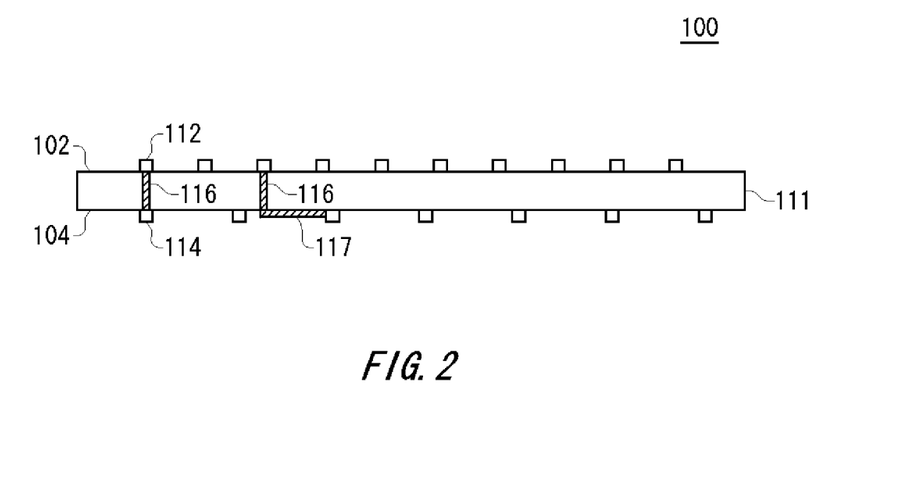
FIG. 2 is an exemplary side view of a probe wafer 100.

FIG. 2 is an exemplary side view of the probe wafer 100. As described above, the probe wafer 100 has the wafer connecting surface 102 that opposes the semiconductor wafer 300 and the device connecting surface 104 that is opposite to the wafer connecting surface 102. The wafer connector terminals 112 are formed on the wafer connecting surface 102, and the device connector terminals 114 are formed on the device connecting surface 104. The device connector terminals 114 may be provided in a one-to-one correspondence with the wafer connector terminals 112. The terminals of the probe wafer 100 may be formed on the wafer substrate 111 by performing plating, vapor-deposition or the like of an electrically-conductive material.

The probe wafer 100 may have a plurality of through holes 116 each of which electrically connects one of the device connector terminals 114 to a corresponding one of the wafer connector terminals 112. The through holes 116 penetrate the wafer substrate 111.

The device connector terminals 114 may be arranged at certain intervals different from the intervals at which the wafer connector terminals 112 are arranged. The wafer connector terminals 112 are arranged at certain intervals that are the same as the intervals at which the input terminals of the semiconductor chips 310 are arranged in order to establish electrical connection therebetween. Thus, the wafer connector terminals 112 are arranged in such a manner that a series of wafer connector terminals 112 corresponding to one semiconductor chip 310 are arranged at minute intervals from each other, for example, as shown in FIG. 1.

The device connector terminals 114 may be arranged at certain intervals that are larger than the intervals at which a plurality of wafer connector terminals 112 corresponding to a single semiconductor chip 310 are arranged. For example, the device connector terminals 114 may be arranged at even intervals so as to be substantially uniformly distributed within the device connecting surface 104. Furthermore, the wafer substrate 111 may have interconnections 117 formed thereon to electrically connect the terminals to the through holes 116.

Although not shown in FIG. 2, the circuit units 110 may be formed on the device connecting surface 104 or the wafer connecting surface 102 of the wafer substrate 111. The circuit units 110 may be formed on an intermediate layer of the wafer substrate 111. Each circuit unit 110 is electrically connected to one or more corresponding wafer connector terminals 112 and one or more corresponding device connecter terminals 114.

Figure 3:
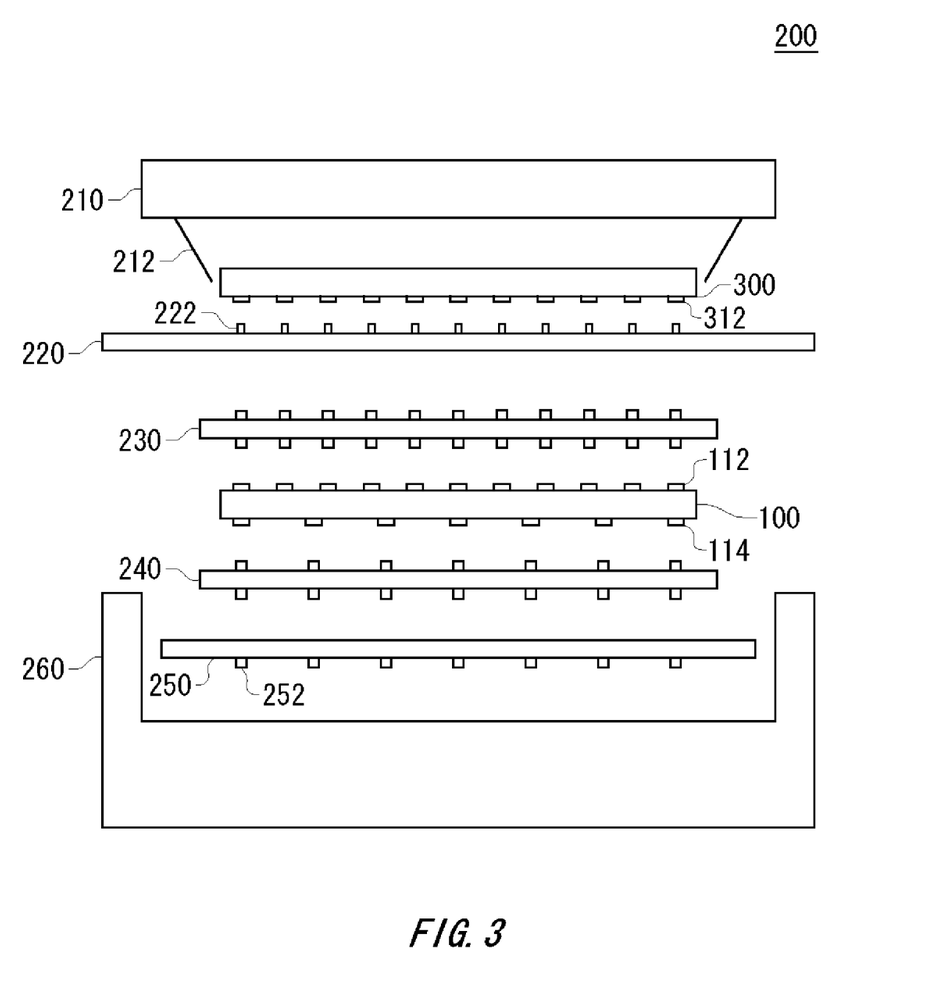
FIG. 3 is a cross-sectional view illustrating an exemplary configuration of a probe device 200 having the probe wafer 100.

FIG. 3 is a cross-sectional view illustrating an exemplary configuration of a probe device 200 having the probe wafer 100. In the shown example, the respective components of the probe device 200 are separated away from each other. In practice, however, the respective components of the probe device 200 are in contact with vertically adjacent components. Here, the vertical direction is oriented from top to down in FIG. 3. The probe device 200 holds the semiconductor wafer 300 so that electrical connection is formed between the probe wafer 100 and the semiconductor wafer 300.

The probe device 200 includes a wafer tray 210, a wafer-side membrane 220, a wafer-side PCR 230, the probe wafer 100, a device-side PCR 240, a device-side membrane 250, and a device substrate 260. The wafer tray 210 holds the semiconductor wafer 300. For example, the wafer tray 210 opposes the surface of the semiconductor wafer 300 on which no terminals 312 are formed. The wafer tray 210 may be provided with a holder 212 that holds the semiconductor wafer 300.

The holder 212 may be a lock member that locks the semiconductor wafer 300 onto the wafer tray 210. Alternatively, the holder 212 may attract by suction the semiconductor wafer 300 onto the wafer tray 210. In this case, the wafer tray 210 has through holes formed therein, and the holder 212 may attract by suction the semiconductor wafer 300 onto the wafer tray 210 by means of those through holes.

The wafer-side membrane 220 is sandwiched between the semiconductor wafer 300 and the wafer-side PCR 230, and electrically connects the semiconductor wafer 300 to the wafer-side PCR 230. The wafer-side membrane 220 has a plurality of electrically-conductive bumps 222 that penetrate an insulator sheet. The bumps 222 are electrically connected to the terminals of the semiconductor chips 310 of the semiconductor wafer 300. The bumps 222 may be positioned in the same manner as the wafer connecter terminals 112 of the probe wafer 100.

The wafer-side PCR 230 is sandwiched between the wafer-side membrane 220 and the probe wafer 100, and electrically connects the bumps 222 of the wafer-side membrane 220 to the wafer connecter terminals 112 of the probe wafer 100. The wafer-side PCR 230 may be formed by an anisotropic electrically-conductive film sheet, and electrically connects the bumps 222 to the wafer connector terminals 112 when the bumps 222 and the wafer connecter terminals 112 are pressed against the wafer-side PCR 230.

The device-side PCR 240 is sandwiched between the probe wafer 100 and the device-side membrane 250, and electrically connects the device connector terminals 114 of the probe wafer 100 to bumps 252 of the device-side membrane 250. The device-side PCR 240 may be formed by an anisotropic electrically-conductive film sheet, and electrically connects the device connector terminals 114 to the bumps 252 when the device connecter terminals 114 and the bumps 252 are pressed against the device-side PCR 240.

The device-side membrane 250 is sandwiched between the device-side PCR 240 and the device substrate 260, and electrically connects the device-side PCR 240 to the device substrate 260. The device-side membrane 250 has a plurality of electrically-conductive bumps 252 that penetrate an insulator sheet. The bumps 252 are electrically connected to the terminals of the device substrate 260. The bumps 252 may be positioned in the same manner as the device connecter terminals 114 of the probe wafer 100.

To the device substrate 260, the arrangement of the components from the wafer tray 210 to the device-side membrane 250 is secured. For example, the arrangement of the components from the wafer tray 210 to the device substrate 260 may be secured by means of screws, vacuum suction or other methods. The device substrate 260 provides electrical connection between the controller 10 and the bumps 252 of the device-side membrane 250. The device substrate 260 may be a printed circuit board.

The membranes effectively function when the terminals (pads) that are electrically connected to each other via the membranes are small in area, or formed by an aluminum film and the like and thus form an oxide film on the surfaces. Therefore, the membranes may be omitted when the terminals that are electrically connected to each other via the membranes are sufficiently large in area. For example, the probe device 200 may be formed without the device-side membrane 250 since the terminals of the device substrate 260 can be easily made large in area and formed by gold plating or the like.

In the above-described manner, the probe wafer 100 can be electrically connected to the semiconductor wafer 300. The probe wafer 100 can also be electrically connected to the controller 10. It should be noted here that the wafer-side membrane 220 is preferably formed by a material that has a similar coefficient of thermal expansion to the substrate of the semiconductor wafer 300. Likewise, the device-side membrane 250 is preferably formed by a material that has a similar coefficient of thermal expansion to the wafer substrate 111.

Figure 4:
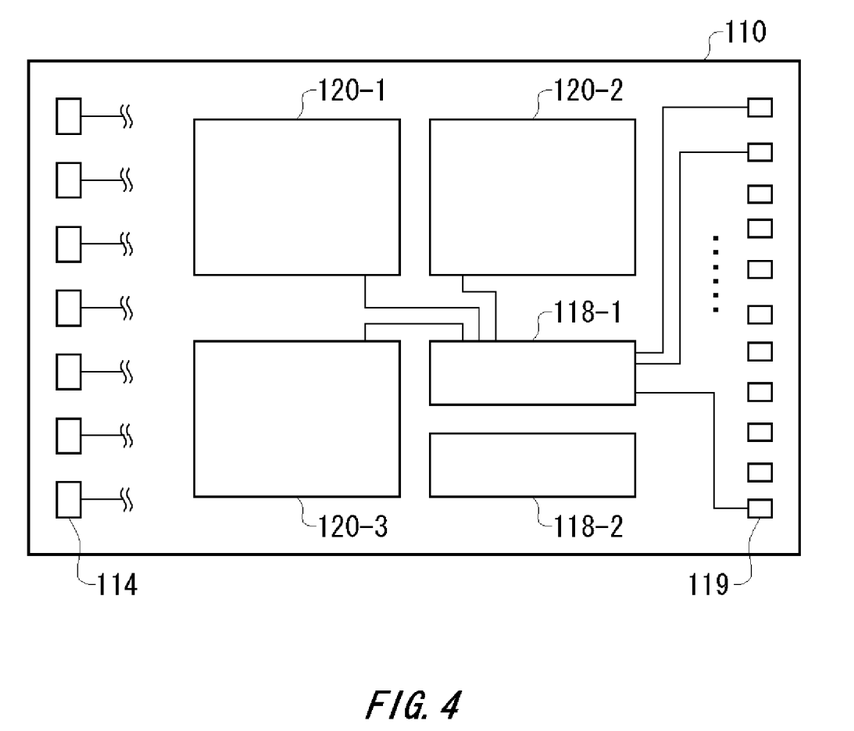
FIG. 4 illustrates an exemplary configuration of a circuit unit 110.

FIG. 4 illustrates an exemplary configuration of the circuit units 110. According to the present example, the circuit units 110 are formed on the device connecting surface 104. Here, the circuit units 110 formed on the wafer substrate 111 may all have the same configuration.

Each circuit unit 110 has a plurality of test circuits 120 and a plurality of switching sections 118. Each circuit unit 110 also has a plurality of pads 119. The pads 119 are electrically connected to the wafer connector terminals 112 formed on the wafer connecting surface 102 via the through holes 116.

The test circuits 120 are connected to the controller 10 via the device connector terminals 114. The test circuits 120 may receive control signals, power and the like from the controller 10. Normally, a first test circuit 120-1 operates, and the remaining test circuits 120 operate when the first test circuit 120-1 breaks down. The test circuits 120 may be the same as each other.

The switching sections 118 select an operating test circuit 120 from the test circuits 120. Normally, a first switching section 118-1 operates, and the remaining switching sections 118 operate when the first switching section 118-1 breaks down. The switching sections 118 may be the same as each other. The operating switching section 118 connects the selected test circuit 120 to a corresponding wafer connecter terminal 112 via a corresponding pad 119 so that the test circuit 120 can tests a corresponding semiconductor chip 310.

Since the circuit units 110 are formed on the semiconductor wafer substrate 111 as described above, the test circuits 120 having semiconductor components can be formed at a high density. Thus, the plurality of test circuits 120 and the like, including backup circuits, can be easily formed within a region corresponding to each semiconductor chip 310. Here, each circuit unit 110 may alternatively have a single test circuit 120 and have no switching sections 118.

Figure 5:
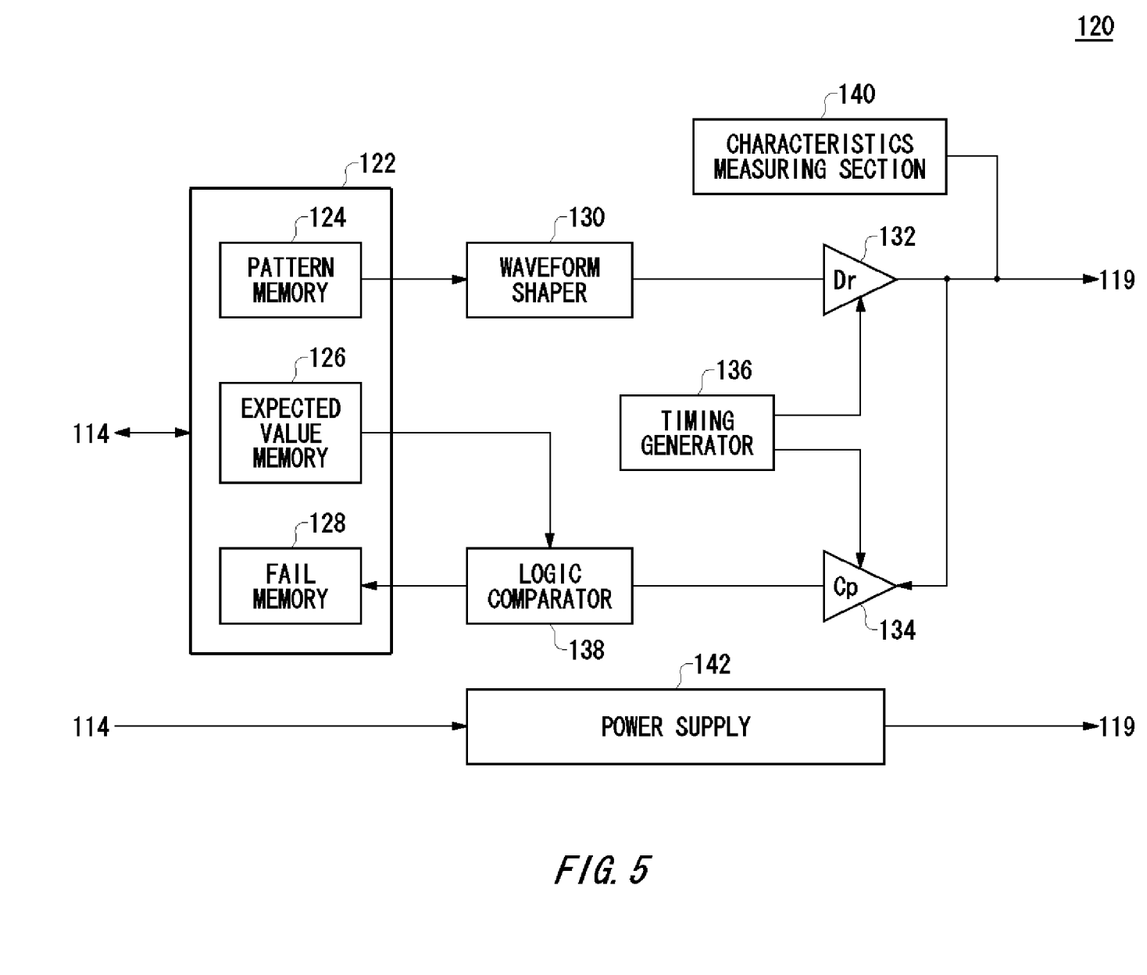
FIG. 5 is a block diagram illustrating an exemplary functional configuration of a test circuit 120.

FIG. 5 is a block diagram illustrating an exemplary functional configuration of the test circuits 120. Each test circuit 120 includes a pattern generator 122, a waveform shaper 130, a driver 132, a comparator 134, a timing generator 136, a logic comparator 138, a characteristics measuring section 140, and a power supply 142. Here, the configuration of the test circuit 120 shown in FIG. 5 may be in correspondence with each of the input/output pins of a semiconductor chip 310 connected to the test circuit 120.

The pattern generator 122 generates a logic pattern for a test signal. According to the present example, the pattern generator 122 is constituted by a pattern memory 124, an expected value memory 126, and a fail memory 128. The pattern generator 122 may output a logic pattern that is stored in advance in the pattern memory 124. The pattern memory 124 may store therein a logic pattern received from the controller 10 before tests start. The pattern generator 122 may alternatively generate a logic pattern based on algorithms supplied in advance.

The waveform shaper 130 shapes a waveform for the test signal based on the logic pattern supplied from the pattern generator 122. For example, the waveform shaper 130 may shape the waveform for the test signal by outputting a voltage corresponding to each of the logic values of the logic pattern for a predetermined bit duration.

The driver 132 outputs a test signal having the waveform supplied from the waveform shaper 130. The driver 132 may output the test signal in accordance with a timing signal supplied from the timing generator 136. For example, the driver 132 may output the test signal with the same period as the timing signal. The test signal output from the driver 132 is supplied to a corresponding semiconductor chip 310 via the switching sections 118 and the like.

The comparator 134 measures a response signal output from the semiconductor chip 310. For example, the comparator 134 may sequentially detect the logic values of the response signal in correspondence with a strobe signal supplied from the timing generator 136, to measure the logic pattern of the response signal.

The logic comparator 138 functions as a judging section that judges whether the corresponding semiconductor chip 310 is acceptable based on the logic pattern of the response signal measured by the comparator 134. For example, the logic comparator 138 may judge whether the semiconductor chip 310 is acceptable by examining whether the logic pattern detected by the comparator 134 matches an expected value pattern supplied from the pattern generator 122. The pattern generator 122 may supply to the logic comparator 138 an expected value pattern that is stored in the expected value memory 126 in advance. The expected value memory 126 may store therein a logic pattern supplied from the controller 10 before tests start. Alternatively, the pattern generator 122 may generate an expected value pattern based on algorithms supplied in advance.

The fail memory 128 stores the result of the comparison done by the logic comparator 138. For example, when the test circuit 120 is adapted to test the memory region of the semiconductor chip 310, the fail memory 128 may store the result of the judgment made by the logic comparator 138 in association with each of the addresses of the semiconductor chip 310. The controller 10 may read the judgment results stored in the fail memory 128. For example, the device connector terminals 114 may output the judgment results stored in the fail memory 128 to the controller 10, which is external to the probe wafer 100.

The characteristics measuring section 140 measures the waveform of the voltage or current output from the driver 132. For example, the characteristics measuring section 140 may function as a judging section that judges whether the semiconductor chip 310 is acceptable by examining whether the waveform of the current or voltage supplied from the driver 132 to the semiconductor chip 310 satisfies a predetermined specification.

The power supply 142 supplies power used to drive the semiconductor chip 310. For example, the power supply 142 may supply to the semiconductor chip 310 power that is determined by the power supplied thereto from the controller 10 during tests. The power supply 142 may supply driving power to the respective constituents of the test circuit 120.

Since the test circuit 120 is configured in the above-described manner, the testing system 400 can be realized with the reduced-scale controller 10. For example, the controller 10 can be implemented by a general-purpose personal computer or the like.

Figure 6:
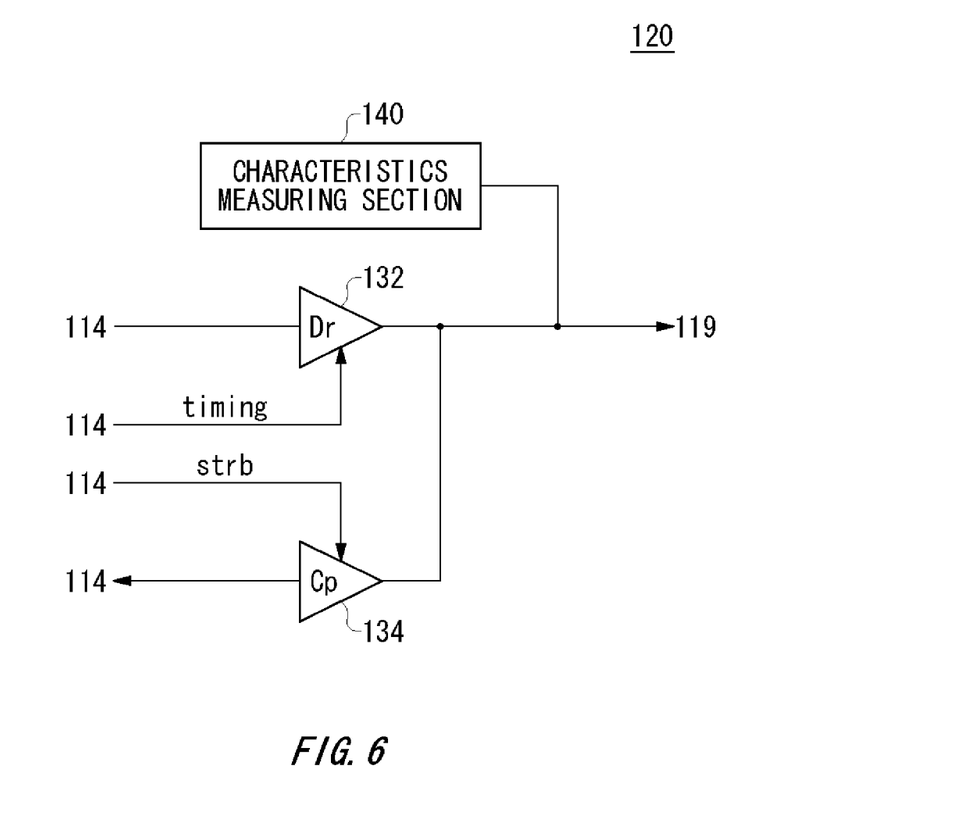
FIG. 6 illustrates another exemplary configuration of the test circuit 120.

FIG. 6 illustrates another exemplary configuration of the test circuit 120. The test circuit 120 relating to the present example has some of the constituents shown in FIG. 5. For example, the test circuit 120 may only include the driver 132, the comparator 134, and the characteristics measuring section 140. The driver 132, the comparator 134, and the characteristics measuring section 140 may be the same as the driver 132, the comparator 134, and the characteristics measuring section 140 described with reference to FIG. 5.

In the present example, the controller 10 may include the pattern generator 122, the waveform shaper 130, the timing generator 136, the logic comparator 138, and the power supply 142 that are described with reference to FIG. 5. The test circuit 120 outputs a test signal in accordance with a control signal supplied from the controller 10. The test circuit 120 also sends the result of the measurement done by the comparator 134 to the controller 10. Configuring the test circuit 120 in the above-described manner can also reduce the scale of the controller 10.

Figure 7:
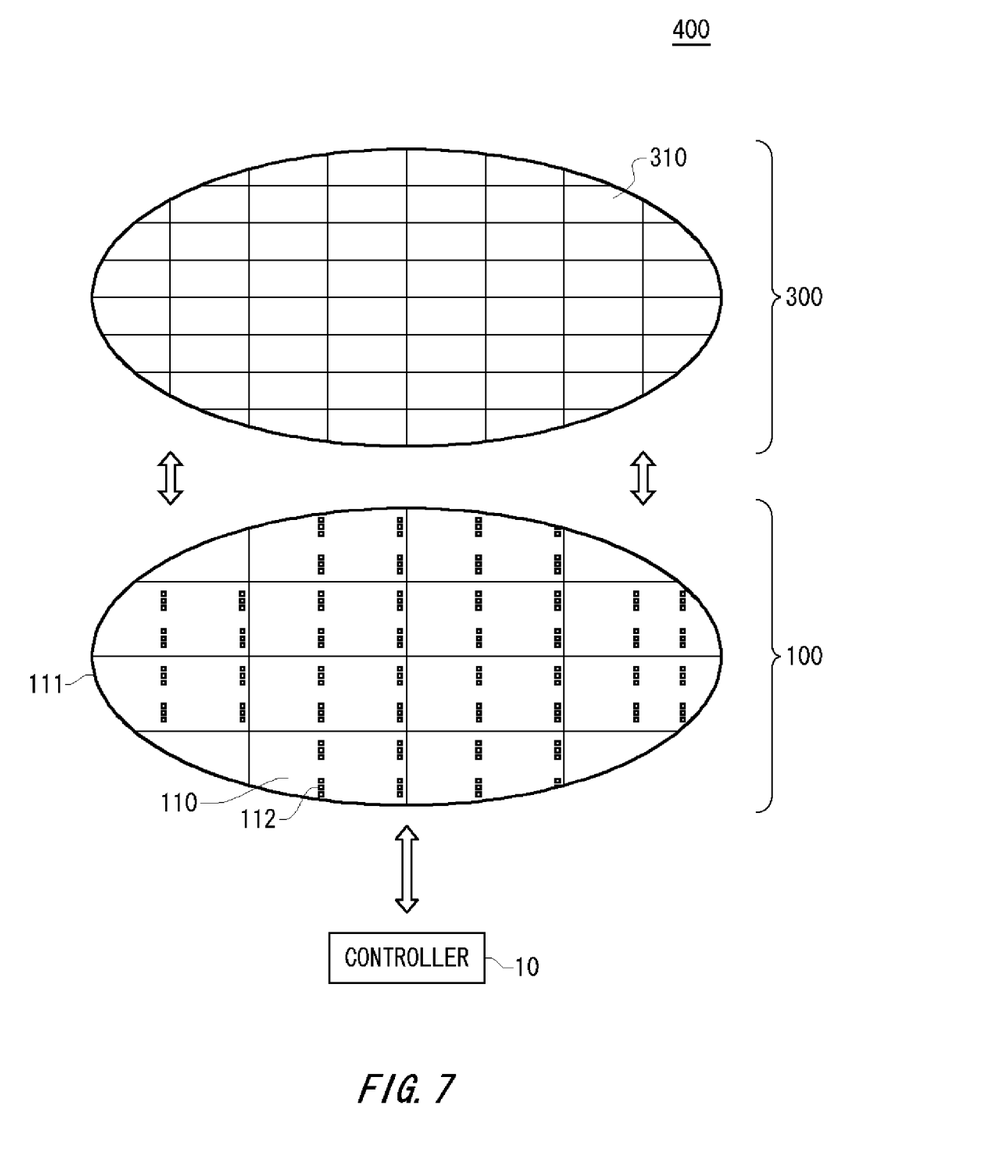
FIG. 7 illustrates another exemplary configuration of the testing system 400.

FIG. 7 illustrates another exemplary configuration of the testing system 400. According to the probe wafer 100 of the present example, each circuit unit 110 is associated with a predetermined number of semiconductor chips 310. In the present example, each circuit unit 110 selects one of the corresponding semiconductor chips 310 and tests the selected semiconductor chip 310.

Figure 8:
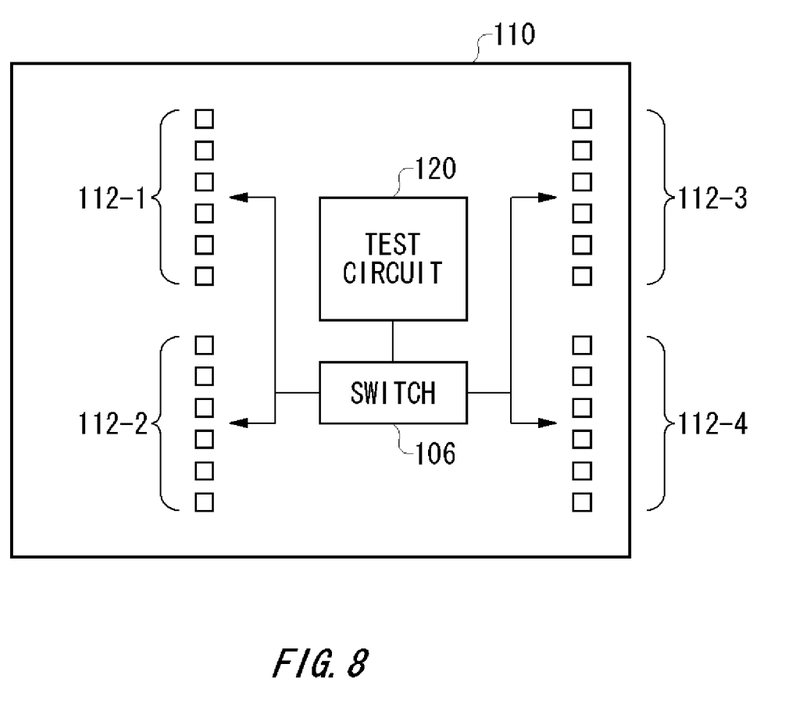
FIG. 8 illustrates an exemplary configuration of the circuit unit 110 described with reference to FIG. 7.

FIG. 8 illustrates an exemplary configuration of the circuit unit 110 described with reference to FIG. 7. According to the present example, the circuit unit 110 includes a test circuit 120 and a switch 106. The test circuit 120 may be the same as one of the test circuits 120 described with reference to FIGS. 4 to 6.

The switch 106 switches which one of the semiconductor chips 310 is connected to the test circuit 120. Specifically speaking, the switch 106 connects the test circuit 120 to one or more wafer connector terminals 112 associated with a semiconductor chip 310 to be tested. The switch 106 may connect the test circuit 120 sequentially to the respective groups of the wafer connector terminals 112 associated with the respective semiconductor chips 310 so that the test circuit 120 can sequentially test the respective semiconductor chips 310. The test circuit 120 may sequentially test every one of the semiconductor chips 310. In this manner, all of the semiconductor chips 310 can be tested even when the number of test circuits 120 formed on the wafer substrate 111 cannot be made large enough to become equal to the number of semiconductor chips 310.

Figure 9:
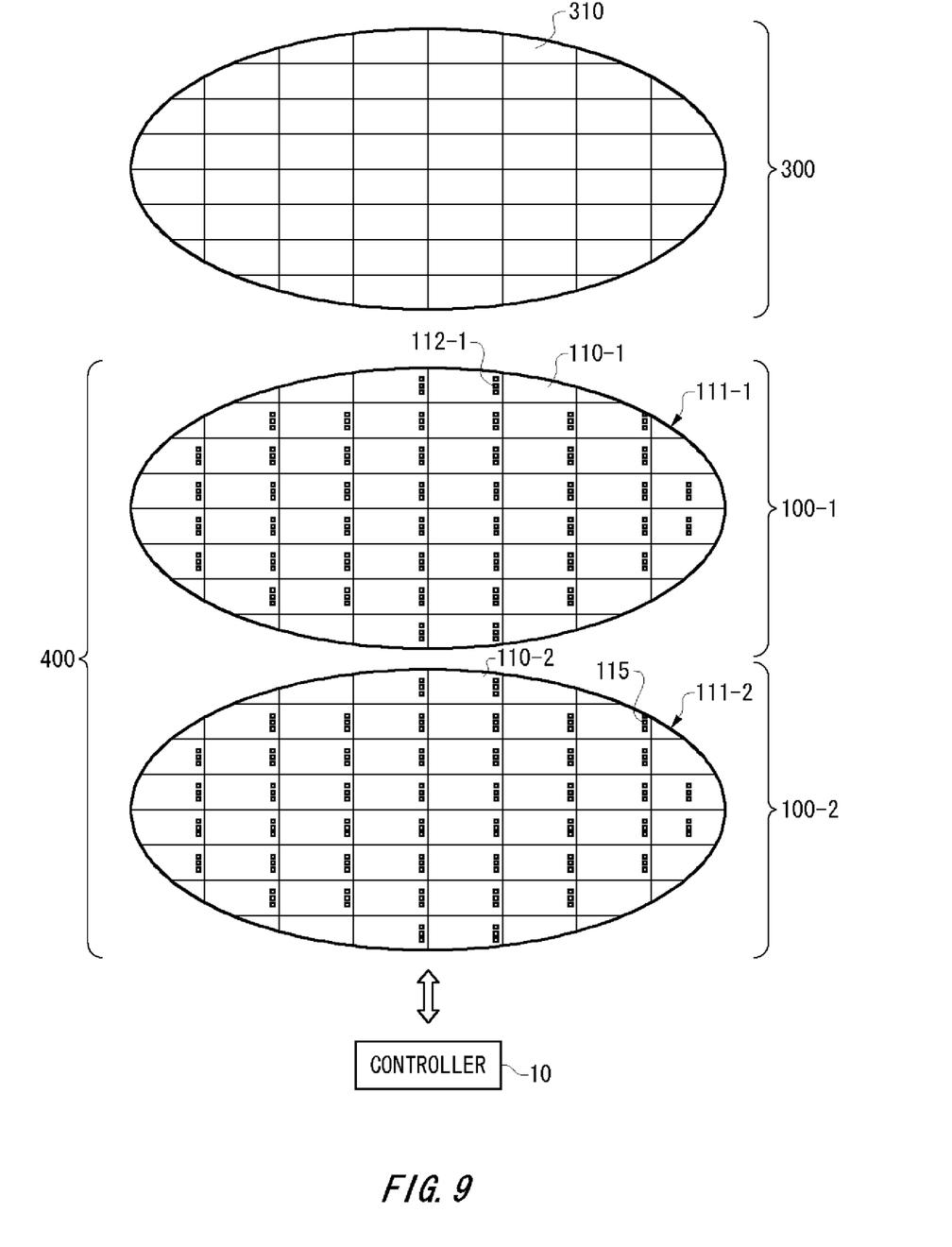
FIG. 9 illustrates another exemplary configuration of the testing system 400.

FIG. 9 illustrates another exemplary configuration of the testing system 400. According to the present example, the testing system 400 includes a probe wafer 100-1 on the side of a wafer under test, a probe wafer 100-2 on the side of the controller, and the controller 10. The probe wafer 100-1 is sandwiched between the semiconductor wafer 300 and the probe wafer 100-2. The probe wafer 100-2 is sandwiched between the probe wafer 100-1 and the controller 10.

In the present example, the probe wafer 100-1 functions as a first probe wafer, and the probe wafer 100-2 functions as a second probe wafer. The probe wafers 100-1 and 100-2 each may have a circular surface having substantially the same diameter as the surface of the semiconductor wafer 300 on which the semiconductor chips 310 are formed.

The probe wafers 100-1 and 100-2 each may have the same functions and constituents as the probe wafer 100 described with reference to FIGS. 1 to 8. However, first circuit units 110-1 of the probe wafer 100-1 may have different circuits than second circuit units 110-2 of the probe wafer 100-2.

For example, the first circuit units 110-1 may each have some of the constituents of the test circuit 120 shown in FIG. 5, and the second circuit units 110-2 may each have the rest of the constituents of the test circuit 120 shown in FIG. 5. Stated differently, each of the first circuit units 110-1 operates together with a corresponding one of the second circuit units 110-2, to test a corresponding semiconductor chip 310. Each of the first circuit units 110-1 may be associated with at least one of the second circuit units 110-2. Each of the second circuit units 110-2 may be associated with at least one of the first circuit units 110-1.

More specifically, each second circuit unit 110-2 may generate a logic pattern for a signal to be supplied to a corresponding semiconductor chip and supply the generated signal to a corresponding one of the first circuit unit 110-1. In this case, each second circuit unit 110-2 may include the pattern generator 122 described with reference to FIG. 5.

Each first circuit unit 110-1 may shape a waveform for a signal to be supplied to a corresponding semiconductor chip 310 based on the signal supplied thereto from a corresponding one of the second circuit units 110-2. In this case, each first circuit unit 110-1 may include the waveform shaper 130 described with reference to FIG. 5.

Alternatively, the second circuit units 110-2 may each have, from among the components of the circuit to test the semiconductor chips 310, the components that are always used irrespective of the types of the semiconductor chips 310 or the types of the tests performed on the semiconductor chips 310. On the other hand, the first circuit units 110-1 may each have, from among the components of the circuit to test the semiconductor chips 310, the components that need to be changed depending on the types of the semiconductor chips 310 or the types of the tests performed on the semiconductor chips 310. In this manner, the probe wafer 100-2 on the side of the controller can be used for a plurality of different types of semiconductor chips 310. This will result in test cost reduction.

As a further alternative example, the second circuit units 110-2 may each have all of the components of the test circuit 120 shown in FIG. 5. In this case, the probe wafer 100-1 on the side of the wafer under test may not need the first circuit units 110-1. For example, the probe wafer 100-1 may serve as a pitch conversion substrate that provides electrical connection between the probe wafer 100-2 and the semiconductor wafer 300 on which the terminals are arranged at different intervals from the terminals arranged on the probe wafer 100-2.

In this case, the probe wafer 100-1 may have, on its surface opposing the probe wafer 100-2, first intermediate connector terminals that are positioned in the same manner as second intermediate connector terminals 115 of the probe wafer 100-2. The probe wafer 100-1 may also have, on its surface opposing the semiconductor wafer 300, the wafer connector terminals 112 that are positioned in the same manner as the terminals 312 of the semiconductor wafer 300. Each of the first intermediate connector terminals is electrically connected to a corresponding one of the wafer connector terminals 112 by means of a through hole 116 that penetrates a first wafer substrate 111-1.

When the testing system 400 having the above-described configuration sequentially tests a plurality of different types of semiconductor wafers 300 that differ from each other in terms of the arrangements of the terminals 312, the probe wafer 100-1 on the side of the wafer under test needs to be changed but the probe wafer 100-2 on the side of the controller can be shared. This will result in a test cost reduction.

Each first circuit unit 110-1 may have an interconnecting circuit that connects a corresponding second circuit unit 110-2 to a predetermined semiconductor chip 310. In other words, the testing system 400 may switch which semiconductor chip 310 is connected to each second circuit unit 110-2 by changing the probe wafer 100-1.

Alternatively, each first circuit unit 110-1 may include a switching circuit that switches which semiconductor chip 310 is connected to a corresponding second circuit unit 110-2. In this case, the controller 10 may switch which semiconductor chip 310 is connected to each second circuit unit 110-2 by controlling the first circuit units 110-1.

Each first circuit unit 110-1 may include an interconnecting circuit that connects the terminals of a corresponding second circuit unit 110-2 to predetermined terminals of a corresponding semiconductor chip 310. Alternatively, each first circuit unit 110-1 may include a switching circuit that switches which terminals of a corresponding semiconductor chips 310 are connected to the terminals of a corresponding second circuit unit 110-2.

As described above, the testing system 400 has two probe wafers 100 at least one of which is changeable. Consequently, the testing system 400 can test a wide variety of semiconductor wafers 300 at a reduced cost.

Figure 10:
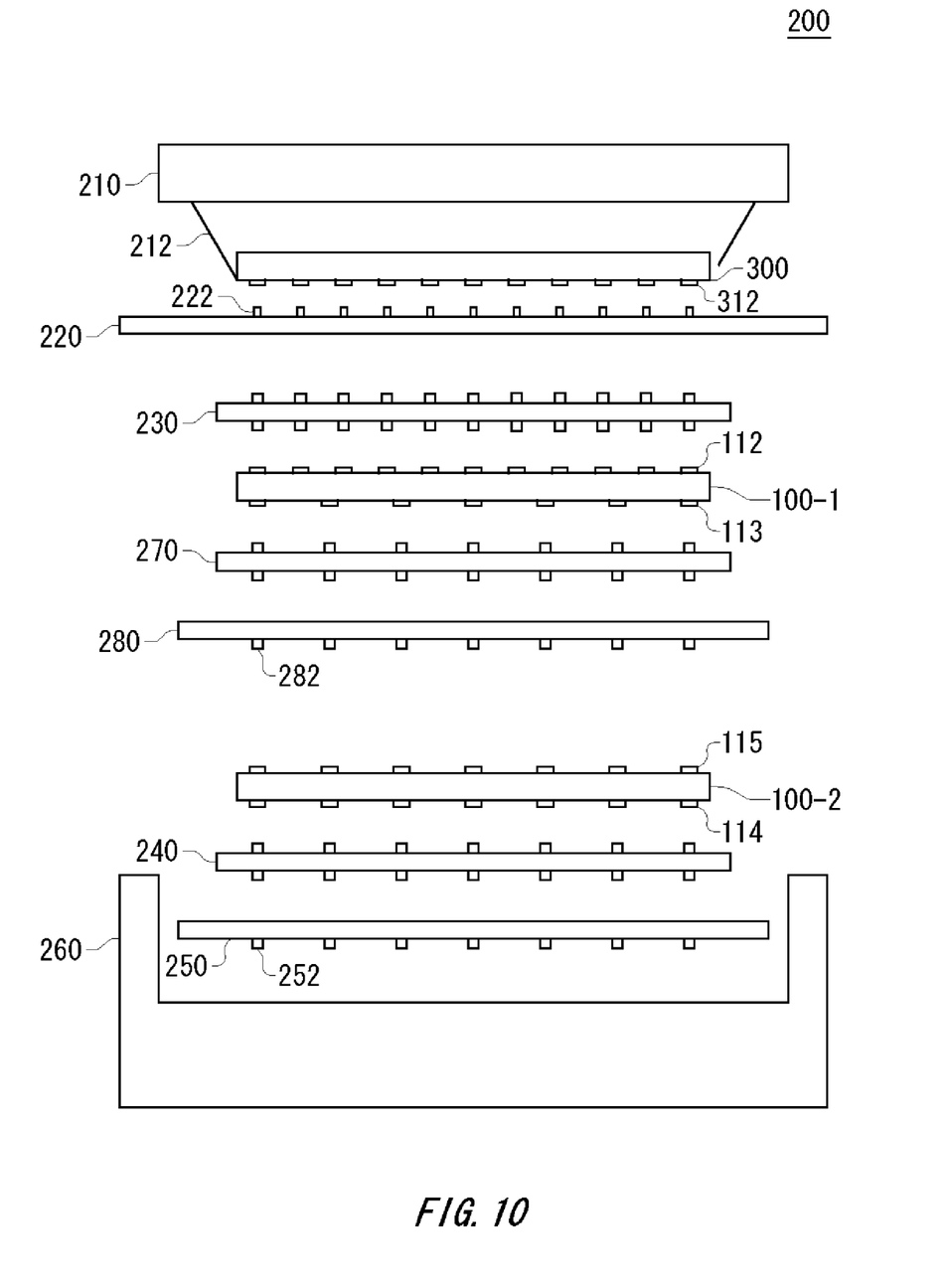
FIG. 10 is a cross-sectional view illustrating an exemplary configuration of a probe device 200 constituted by two probe wafers 100.

FIG. 10 is a cross-sectional view illustrating an exemplary configuration of the probe device 200 constituted by two probe wafers 100. In the shown example, the respective components of the probe device 200 are separated away from each other. In practice, however, the respective components of the probe device 200 are in contact with vertically adjacent components. Here, the vertical direction is oriented from top to down in FIG. 10.

The probe device 200 includes a wafer tray 210, a wafer-side membrane 220, a wafer-side PCR 230, a probe wafer 100, a device-side PCR 240, a device-side membrane 250, an intermediate PCR 270, an intermediate membrane 280, and a device substrate 260. The wafer tray 210 holds the semiconductor wafer 300.

The wafer tray 210, wafer-side membrane 220, and wafer-side PCR 230 may have the same functions and configurations as the wafer tray 210, wafer-side membrane 220, and wafer-side PCR 230 described with reference to FIG. 3. The wafer-side PCR 230 is sandwiched between the wafer-side membrane 220 and the probe wafer 100-1, and electrically connects the bumps 222 of the wafer-side membrane 220 to the wafer connecter terminals 112 of the probe wafer 100-1.

The probe wafer 100-1 has a plurality of first intermediate connecter terminals 113 on its surface opposing the intermediate PCR 270. Each of the first intermediate connecter terminals 113 may be electrically connected to a corresponding one of the wafer connector terminals 112 via a through hole 116, similarly to the device connector terminals 114 described with reference to FIG. 2. The first intermediate connector terminals 113 are positioned in the same manner as a plurality of second intermediate connector terminals 115, described later. The first intermediate connector terminals 113 may be positioned differently from the wafer connector terminals 112.

The intermediate PCR 270 is sandwiched between the probe wafer 100-1 and the intermediate membrane 280, and electrically connects the first intermediate connector terminals 113 of the probe wafer 100-1 to the bumps 282 of the intermediate membrane 280. The intermediate PCR 270 may be formed by an anisotropic electrically-conductive film sheet, and electrically connects the first intermediate connector terminals 113 to the bumps 282 when the first intermediate connecter terminals 113 and the bumps 282 are pressed against the intermediate PCR 270.

The intermediate membrane 280 is sandwiched between the intermediate PCR 270 and the probe wafer 100-2, and electrically connects the intermediate PCR 270 to the probe wafer 100-2. The intermediate membrane 280 has a plurality of electrically-conductive bumps 282 that penetrate an insulator sheet. The bumps 282 are electrically connected to the second intermediate connector terminals 115 of the probe wafer 100-2. The bumps 282 may be positioned in the same manner as the second intermediate connector terminals 115 of the probe wafer 100-2.

The probe wafer 100-2 has, on the surface of the second wafer substrate 111-2 that opposes the intermediate membrane 280, a plurality of second intermediate connector terminals 115 in a one-to-one correspondence with the plurality of first intermediate connector terminals 113. The second intermediate connector terminals 115 may be electrically connected to the device connector terminals 114 via the through holes that penetrate the second wafer substrate 111-2. The second intermediate connector terminals 115 may be positioned in the same manner as the device connector terminals 114.

The device-side PCR 240, device-side membrane 250, and device substrate 260 may have the same functions and configurations as the device-side PCR 240, device-side membrane 250, and device substrate 260 described with reference to FIG. 3. The device-side PCR 240 is sandwiched between the probe wafer 100-2 and the device-side membrane 250, and electrically connects the probe wafer 100-2 to the device-side membrane 250. In the above-described manner, the probe device 200 can test the semiconductor wafer 300 by using the two probe wafers 100.

As described with reference to FIG. 3, the probe device 200 relating to the present example may be implemented without any of the membranes. For example, similarly to the example described with reference to FIG. 3, the probe device 200 may not need the device-side membrane 250. Furthermore, the probe device 200 may not need the intermediate membrane 280 since the terminals of the probe wafer 100 can also be relatively easily made large in area and formed from gold plating or the like.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A probe wafer to be electrically connected to a semiconductor wafer having a plurality of semiconductor chips formed thereon, the probe wafer comprising:
   a wafer substrate;
   a plurality of wafer connector terminals that are provided on the wafer substrate in such a manner that one or more wafer connector terminals correspond to each of the semiconductor chips, each wafer connector terminal to be electrically connected to an input/output terminal of a corresponding semiconductor chip;
   a plurality of circuit units that are provided on the wafer substrate in such a manner that each of the circuit units corresponds to a predetermined number of semiconductor chips, each circuit unit generating signals to be supplied to a predetermined number of corresponding semiconductor chips; and
   one or more switches, each switch corresponding to one of the circuit units, that switches which one of the predetermined number of corresponding semiconductor chips is connected to the corresponding circuit unit, wherein
   a wafer connecting surface of the wafer substrate, on which the wafer connector terminals are provided, is brought into contact with the semiconductor wafer via an anisotropic electrically conductive film such that the anisotropic electrically conductive film is sandwiched between the probe wafer and a wafer-side membrane formed by a material that has a similar coefficient of thermal expansion to the substrate of the semiconductor wafer.

2. The probe wafer as set forth in claim 1, wherein the circuit units have the same configuration as each other.

3. The probe wafer as set forth in claim 1, wherein each of the circuit units generates a test signal used to test the corresponding semiconductor chip connected to the circuit unit and supplies the test signal to the corresponding semiconductor chip connected to the circuit unit.

4. The probe wafer as set forth in claim 3, wherein each of the circuit units judges whether the corresponding semiconductor chip connected to the circuit unit is acceptable based on a response signal output from the corresponding semiconductor chip connected to the circuit unit in response to the test signal.

5. The probe wafer as set forth in claim 4, wherein each of the circuit units includes:
   a pattern generator that generates a logic pattern for the test signal;
   a waveform shaper that shapes a waveform for the test signal based on the logic pattern and outputs the waveform;
   a comparator that measures the response signal; and
   a judging section that judges whether the corresponding semiconductor chip connected to the circuit unit is acceptable based on a result of the measurement made by the comparator.

6. The probe wafer as set forth in claim 5, wherein the wafer substrate has
   a device connecting surface that is opposite to the wafer connecting surface, and
   the probe wafer further comprises
   a device connecter terminal that is provided on the device connecting surface of the wafer substrate, the device connector terminal outputting results of the judgments made by the circuit units to an external device.

7. The probe wafer as set forth in claim 6, wherein
the wafer substrate is formed from the same semiconductor material as the substrate of the semiconductor wafer.

8. The probe wafer as set forth in claim 6, wherein
the wafer connecting surface of the wafer substrate has substantially the same shape as a surface of the semiconductor wafer on which the semiconductor chips are formed.

9. The probe wafer as set forth in claim 6,
wherein the device connecting surface of the wafer substrate is brought into a contact with the external device via the anisotropic electrically conductive film.

10. A testing system for testing a plurality of semiconductor chips formed on a single semiconductor wafer, the testing system comprising:
the probe wafer as set forth in claim 3, the probe wafer to be electrically connected to the semiconductor wafer; and
a controller that generates a control signal used to control the plurality of circuit units.

11. The probe wafer as set forth in claim 1, wherein
the wafer substrate is formed from a different semiconductor material than the substrate of the semiconductor wafer.

12. A probe device to be electrically connected to a semiconductor wafer having a plurality of semiconductor chips formed thereon, the probe device comprising:
a first probe wafer that is to be electrically connected to the semiconductor wafer; and
a second probe wafer that is electrically connected to the first probe wafer, wherein
the first probe wafer includes:
a first wafer substrate;
a plurality of wafer connector terminals that are provided on the first wafer substrate in such a manner that one or more wafer connector terminals correspond to each of the semiconductor chips, each wafer connector terminal to be electrically connected to an input/output terminal of a corresponding semiconductor chip;
a plurality of first intermediate connector terminals that are electrically connected to the plurality of wafer connector terminals; and
a plurality of first circuit units that are provided in such a manner that one or more first circuit units correspond to each of the semiconductor chips, each first circuit unit outputting a signal in accordance with a signal received from the second probe wafer, and
the second probe wafer includes:
a second wafer substrate that opposes a surface of the first wafer substrate on which the plurality of first intermediate connector terminals are formed;
a plurality of second intermediate connector terminals that are formed on the second wafer substrate in a one-to-one correspondence with the plurality of first intermediate connecter terminals, each second intermediate connector terminal being electrically connected to a corresponding one of the first intermediate connector terminals; and
a plurality of second circuit units that are provided in such a manner that one or more second circuit units correspond to each of the first circuit units, each second circuit unit generating a signal to be supplied to a corresponding first circuit unit.

13. The probe device as set forth in claim 12, wherein
each of the plurality of first circuit units and corresponding one or more of the plurality of second circuit units together generate a signal used to test a corresponding one of the plurality of semiconductor chips.

14. The probe device as set forth in claim 13, wherein
the first wafer substrate and the second wafer substrate are formed from the same semiconductor material as a substrate of the semiconductor wafer.

15. The probe device as set forth in claim 13, wherein
the first wafer substrate and the second wafer substrate each have a surface having substantially the same shape as a surface of the semiconductor wafer on which the semiconductor chips are formed.

16. A testing system for testing a plurality of semiconductor chips formed on a single semiconductor wafer, the testing system comprising:
the probe device as set forth in claim 12, the probe device to be electrically connected to the semiconductor wafer; and
a controller that generates a control signal.

17. The testing system as set forth in claim 16, wherein
the controller switches which semiconductor chip is connected to each second circuit unit by controlling the first circuit units.

18. A probe wafer to be electrically connected to a semiconductor wafer having a plurality of semiconductor chips formed thereon, the probe wafer comprising:
a wafer substrate;
a plurality of wafer connector terminals that are provided on the wafer substrate in such a manner that one or more wafer connector terminals correspond to each of the semiconductor chips, each wafer connector terminal to be electrically connected to an input/output terminal of a corresponding semiconductor chip;
a plurality of circuit units that are provided on the wafer substrate in such a manner that each of the circuit units corresponds to a predetermined number of semiconductor chips, each circuit unit generating signals to be supplied to a predetermined number of corresponding semiconductor chips; and
one or more switches, each switch corresponding to one of the circuit units, that switches which one of the predetermined number of corresponding semiconductor chips is connected to the corresponding circuit unit, wherein
each of the circuit units includes a plurality of test circuits,
when a first test circuit from among the plurality of test circuits breaks down, one or more remaining test circuits from among the plurality of test circuits operates,
each of the circuit units further includes a plurality of switching sections that select a test circuit to operate from among the plurality of test circuits, and
when a first switching section from among the plurality of switching sections breaks down, one or more remaining switching sections from among the plurality of switching sections operates.

* * * * *